(12) United States Patent
Nagasaka

(10) Patent No.: US 7,843,985 B2
(45) Date of Patent: Nov. 30, 2010

(54) LIGHT CHIP AND OPTICAL MODULE

(75) Inventor: Kimio Nagasaka, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 11/721,022

(22) PCT Filed: Dec. 18, 2006

(86) PCT No.: PCT/JP2006/325680

§ 371 (c)(1),
(2), (4) Date: Jun. 6, 2007

(87) PCT Pub. No.: WO2008/075441

PCT Pub. Date: Jun. 26, 2008

(65) Prior Publication Data

US 2009/0207875 A1 Aug. 20, 2009

(51) Int. Cl.
*H01S 5/00* (2006.01)
(52) U.S. Cl. ............................... 372/50.124; 372/43.01
(58) Field of Classification Search ............. 372/50.124
See application file for complete search history.

(56) References Cited

U.S. PATENT DOCUMENTS 5,563,901 A * 10/1996 Otoma et al. ............ 372/50.12
6,687,268 B2 * 2/2004 Kitamura et al. ............... 372/22
2002/0158268 A1 * 10/2002 Matsuda ...................... 257/184
2005/0163182 A1 * 7/2005 Kaneko ........................ 372/50
2006/0023762 A1 2/2006 Nishida et al.
2006/0186396 A1 8/2006 Hiramatsu

FOREIGN PATENT DOCUMENTS

| JP | A 8-153935 | 6/1996 |
| JP | A 2005-123268 | 5/2005 |
| JP | A 2006-66846 | 3/2006 |
| JP | A 2006-229032 | 8/2006 |
| JP | A 2006-351771 | 12/2006 |

* cited by examiner

*Primary Examiner*—Minsun Harvey
*Assistant Examiner*—Xnning Niu
(74) *Attorney, Agent, or Firm*—Oliff & Berridge, PLC

(57) ABSTRACT

There is provided a light chip and an optical module with high reliability.

The light chip 100 according to the present invention is a light chip having a semiconductor laser formed on a first substrate and includes a cavity 18 having an emission surface 22 on the upper surface, a first electrode 24 and a second electrode 26 for driving the semiconductor laser, and a plurality of pad portions 24*a*, 26*a*, for flip-chip bonding to a second substrate, respectively connected to the first electrode and the second electrode, wherein the cavity is, seen in a plan view, formed outside a region 25 formed by connecting the outermost peripheries of the plurality of pad portions by straight lines.

7 Claims, 6 Drawing Sheets

US 7,843,985 B2

LIGHT CHIP AND OPTICAL MODULE

TECHNICAL FIELD

The present invention relates to a light chip and an optical module.

BACKGROUND ART

In general, in the case of flip-chip bonding of a light chip, an electrode pad is arranged on either side thereof with a light receiving and emitting portion being sandwiched therebetween so that the light chip is not inclined after being mounted. When such light chip is subjected to flip-chip bonding, large load is applied on a bump corresponding to the electrode pad in the vertical direction with respective to a substrate surface. As a result, there may be a case in which the light chip is distorted and damage is imparted on, for example, the crystal construction of the light receiving and emitting portion of the light chip, thereby deteriorating the reliability of the light chip.

JP-A-H08-153935, for example, discloses as a method for solving such problem, a method according to which a vertical cavity surface emitting laser and a sub mount are bonded with each other with small load.

DISCLOSURE OF THE INVENTION

An object of the present invention is to provide a light chip and an optical module having high reliability.

The light chip according to the present invention is a light chip having an optical element formed on a first substrate, including:

a cavity having an emission surface on the upper surface;

a first electrode and a second electrode for driving the optical element; and a plurality of pad portions, for flip-chip bonding to a second substrate, connected to the first electrode and the second electrode, respectively, wherein the cavity is, seen in a plan view, formed outside a region formed by connecting outermost peripheries of the plurality of pad portions by straight lines.

In the light chip according to the present invention, the plurality of pad portions may be three pad portions and the cavity may be, seen in a plan view, formed outside a region formed by connecting outermost peripheries of the three pad portions by straight lines.

In the light chip according to the present invention, the plurality of pad portions may be four pad portions and the cavity may be, seen in a plan view, formed outside a region formed by connecting outermost peripheries of the four pad portions by straight lines.

The optical module according to the present invention is an optical module having: a light chip with an optical element on a first substrate; and a second substrate flip-chip connected to the light chip, wherein the light chip includes:

a cavity having an emission surface on the upper surface;

a first electrode and a second electrode for driving the optical element; and a plurality of pad portions respectively connected to the first electrode and the second electrode, wherein the second substrate is provided with a plurality of bumps for flip-chip bonding to the first electrode and the second electrode; and wherein the cavity is, seen in a plan view, formed outside a region formed by connecting outermost peripheries of the plurality of bumps by straight lines.

In the optical module according to the present invention, wherein a resin layer may seal between the light chip and the second substrate.

In the optical module according to the present invention, wherein the optical element may be a vertical cavity surface emitting laser.

BEST MODE FOR CARRYING OUT THE INVENTION

Hereinafter, a preferred embodiment of the present invention will be described with reference to the drawings.

Prior to the description of a light chip and an optical module according to this embodiment, the flip-chip bonding will be initially described.

1. Flip-Chip Bonding

Figure 1:
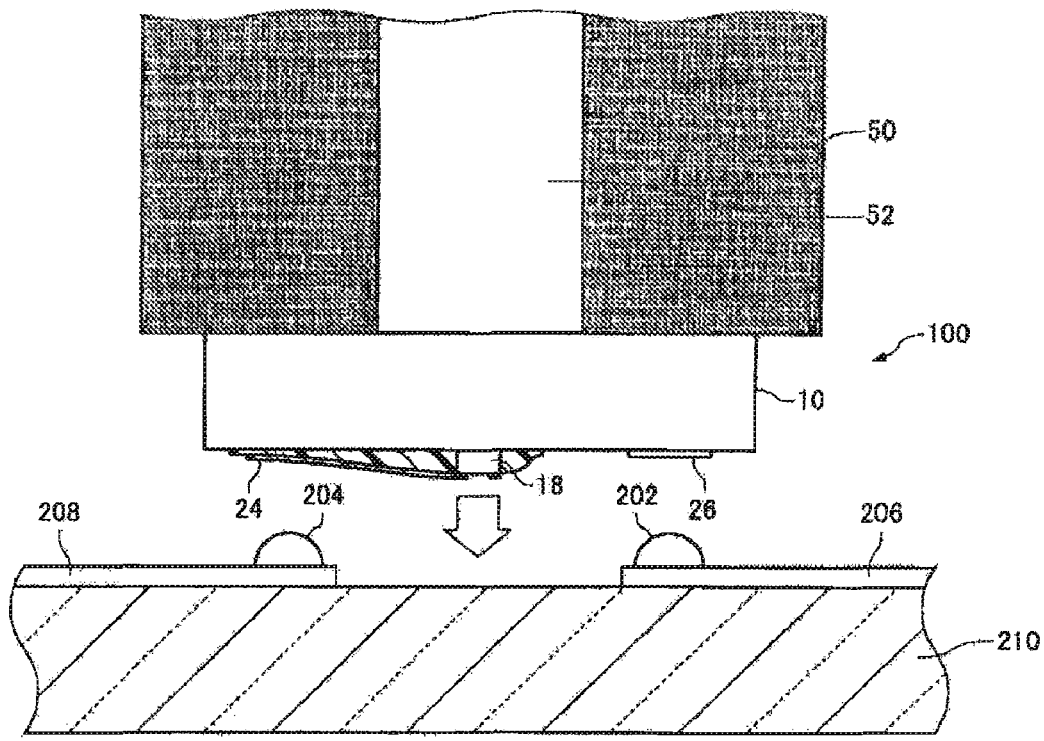
FIG. 1 is a view for illustrating flip-chip bonding.
Figure 2:
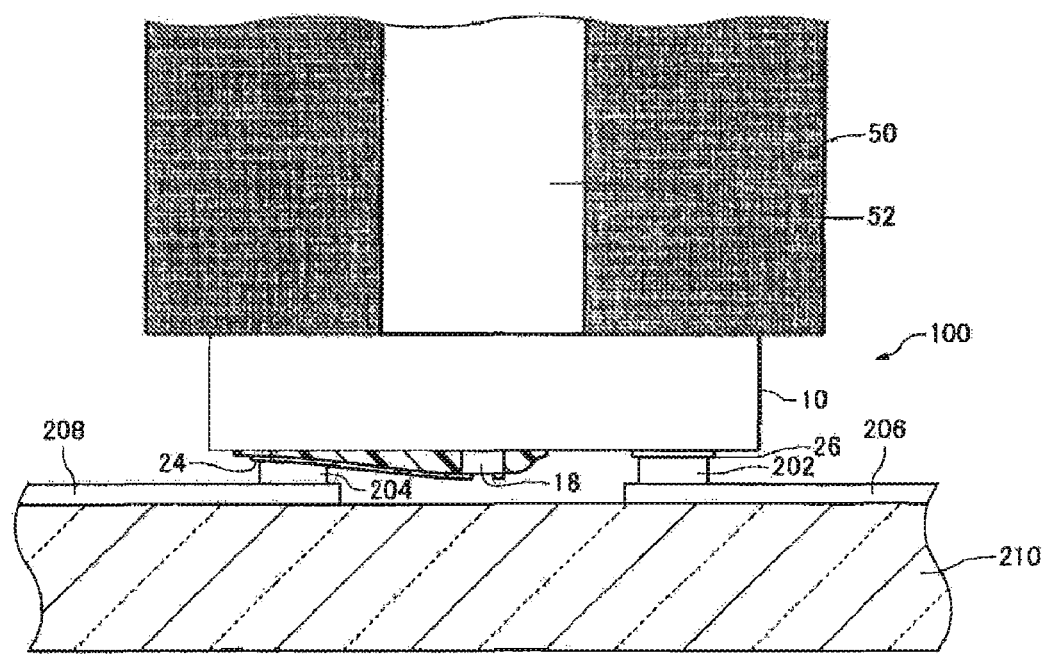
FIG. 2 is a view for illustrating flip-chip bonding.

FIG. 1 and FIG. 2 are views for illustrating the flip-chip bonding. The steps, in which the light chip 100 is flip-chip bonded on a second substrate 210, will be successively explained.

(1) First, as shown in FIG. 1, the light chip 100 is adsorbed by a bonding tool 50 having an adsorption hole 52. The light chop 100 used for this embodiment has a surface emitting type semiconductor laser of vertical cavity surface emitting type as an example of an optical element. To be more specific, the light chip 100 includes a first substrate 10, a cavity 18 having optical cavity function, a first electrode 24, and a second electrode 26. On the other hand, wiring portions 206, 208, a first bump 204, and a second bump 202 are formed on a second substrate 210. It should be noted that in the case of flip-chip bonding using soldering a soldering layer of, for example, solder plating may be formed on the surfaces of the first bump 204 and the second bump 202.

(2) Next, the first bump 204 and the second bump 202 are aligned with a gap being held between the first electrode 24 and the second electrode 26. To be more specific, the alignment is carried out in a way that the pad portion of the first electrode 24 is arranged on the top of the first bump 204 and the pad portion of the second electrode 26 is arranged on the top of the second bump 202.

(3) Then, as shown in FIG. 2, the pad portions of the first electrode 24 and the second electrode 26, and the first bump 204 and the second bump 202 are brought into contact with each other while being heated so as to be pushed in the direction of the arrow (see FIG. 1) by applying appropriate load on the light chip 100. In this case, the pad portion of the first electrode 24, the pad portion of the second electrode 26, the first bump 204, and the second bump 202 are melt due to heat. The bonding tool 50 imparts sufficient load so that the first bump 204 and the second bump 202 are distorted. Note that heating is performed by using laser beam, thereby making it possible to sufficiently heat the desired position on the substrate within a short time. It should be noted that heating may be carried out by using heater besides laser beam.

Through the steps as described above, the light chip 100 and the second substrate 210 can be bonded with each other.

In the above steps, the light chip 100 is pushed towards the second substrate 210 with extreme strong force. At this time, the stress distribution on the entire surface of the light chip 100 is not uniform. To be more specific, tensile stress is generated between the pad portion of the first electrode 24 and the pad portion of the second electrode, so there may be a case in that the light chip 100 is distorted due to tensile stress and subjected to increase in dislocation or crack. In particular, when the cavity 18 of surface emitting type laser is arranged in the area where tensile stress is large, the cavity 18 may be damaged.

2. Light Chip

Figure 3:
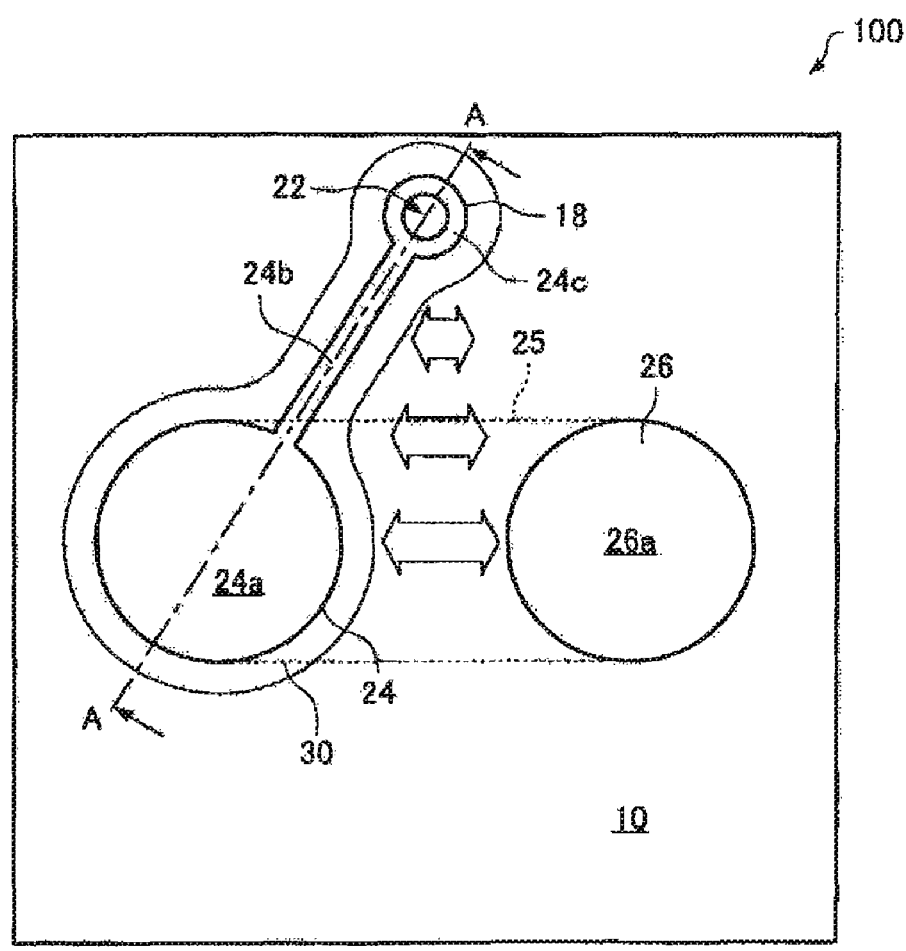
FIG. 3 is a plan view schematically illustrating the light chip according to an embodiment.
Figure 4:
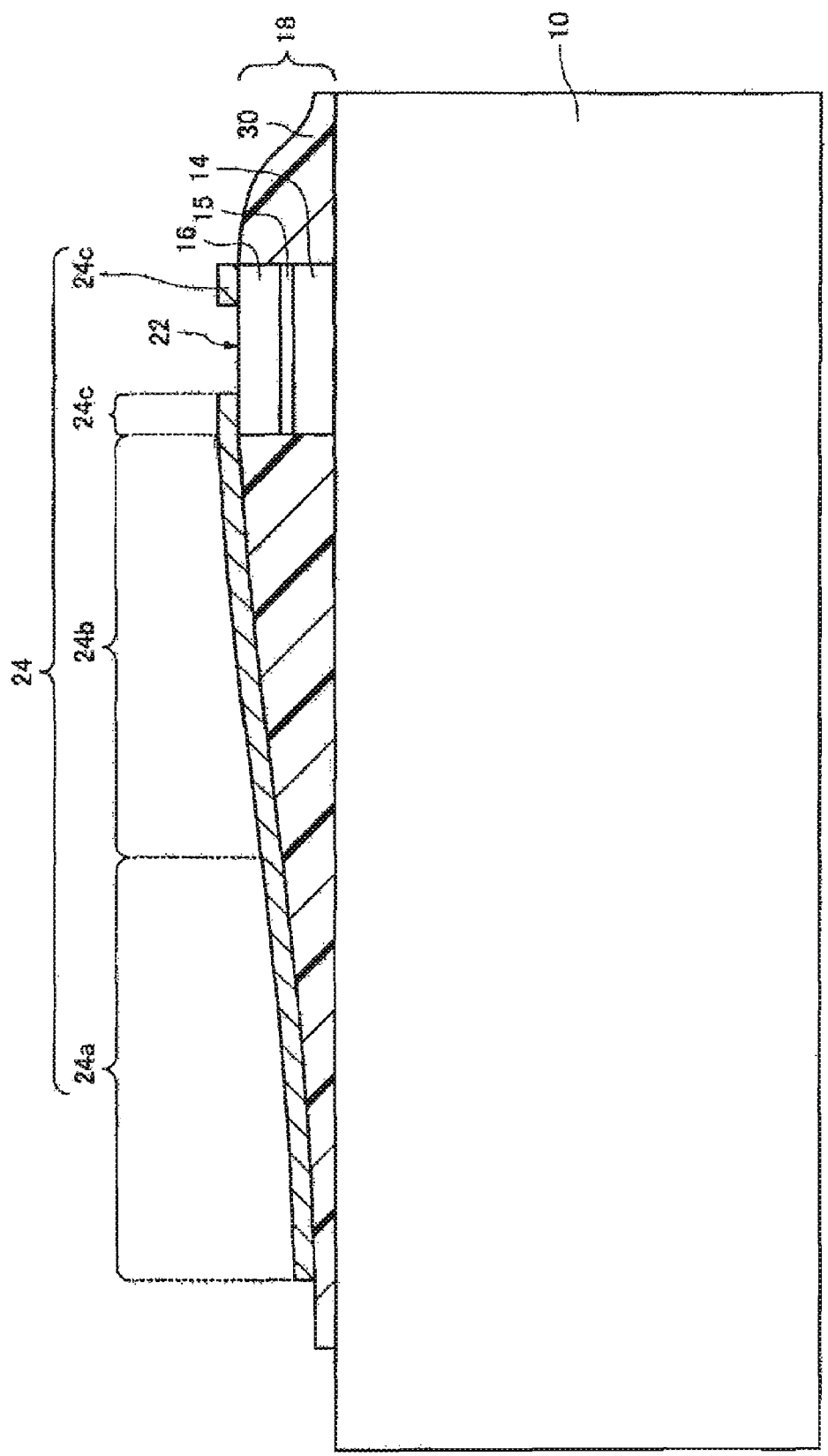
FIG. 4 is a sectional view schematically illustrating the light chip according to the embodiment.

FIG. 3 is a plan view schematically illustrating the light chip according to this embodiment, in which an example of the arrangement of the electrode and the cavity is shown. FIG. 4 is a sectional view schematically illustrating the light chip 100 and is a view showing a section taken along with the line A-A of FIG. 3.

The first substrate 10 is formed of, for example, a GaAs substrate of n type. The cavity 18 of the surface emitting laser is formed on the first substrate 10. The cavity 18 is made from a column-shaped semiconductor assembly and is formed by stacking, as seen from the first substrate 10 side, a first mirror 14, an active layer 15, and a second mirror 16 in order, for example. The cavity 18 serves as, for example, the vertical cavity of a surface emitting laser. Note that in the case of the light chip 100 according to this embodiment, the entire semiconductor assembly on the first substrate 10 is made to be the cavity 18, however, it should not be construed restrictively. For example, in the case in which only the active layer 15 and the second mirror 16 of the semiconductor assembly are subjected to patterning, the patterned active layer 15 and second mirror 16 may be made to be the cavity 18 according to this embodiment. In this embodiment, the cavity 18 has on its upper surface an emission surface 22 for laser light.

As shown in FIG. 4, the first electrode 24 is continuously formed from the upper surface of the cavity 18 until the region of a pad portion for flip-chip bonding with the bump. The first electrode 24 has the pad portion 24a, an extraction portion 24b, and a contact portion 24c. The pad portion 24a is flip-chip bonded to a first bump 204 on the second substrate 210. The contact portion 24c is formed on the upper surface of the cavity 18. The contact portion 24c has a ring-shape and the emission surface 22 is formed at the opening thereof. The extraction portion 24b connects the pad portion 24a and the contact 24c.

The second electrode 26 has a pad portion 26a. The pad portion 26a is flip-chip bonded to a second bump 202 on the second substrate 210. According to this embodiment, the pad portion 26a has a function as a contact portion for the first substrate 20, but this construction should not be construed restrictively. In other words, the second electrode 26 may further include a region other than the pad portion 26a in which the extraction portion and the pad portion 26a exist.

The pad portion 24a and the pad portion 26a each have a circular shape, but it should not be construed restrictively. They may have, for example, a polygon shape.

Of the first electrode 24 and the second electrode 26, the one serves as an anode electrode and the other serves as a cathode electrode.

The light chip 100 further include a resin layer 30 formed so as to surround the cavity 18.

The resin layer 30 is formed between the first electrode 24 and the first substrate 10.

As shown in FIG. 3, the cavity 18 is formed outside of a region 25 formed by connecting the respective outermost peripheries of the pad portion 24a and the pad portion 26a by straight line seen in a plan view. The region 25 includes a formation region of the pad portion 24a and the pad portion 26a and the region surrounded by a broken line therebetween.

3. Optical Module

Hereinafter, an example of the optical module to which the above-described light chip 100 is applied will be described.

Figure 5:
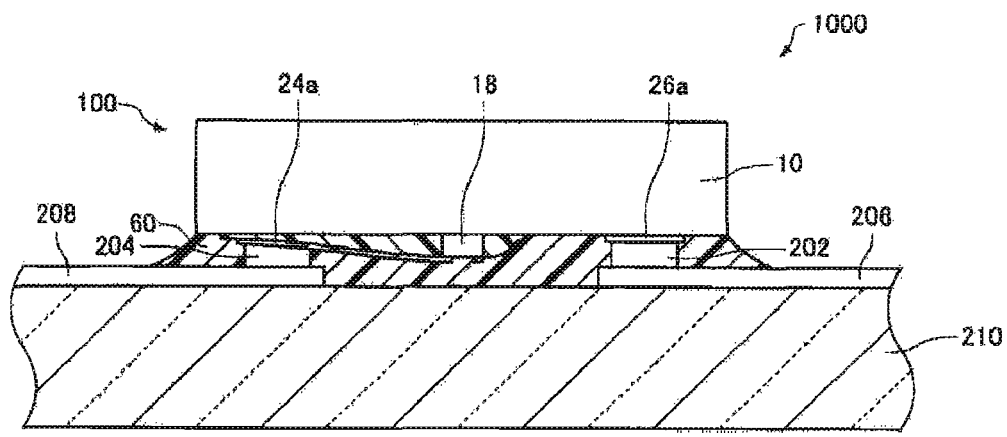
FIG. 5 is a lateral view schematically illustrating an optical module according to the embodiment.
Figure 6:
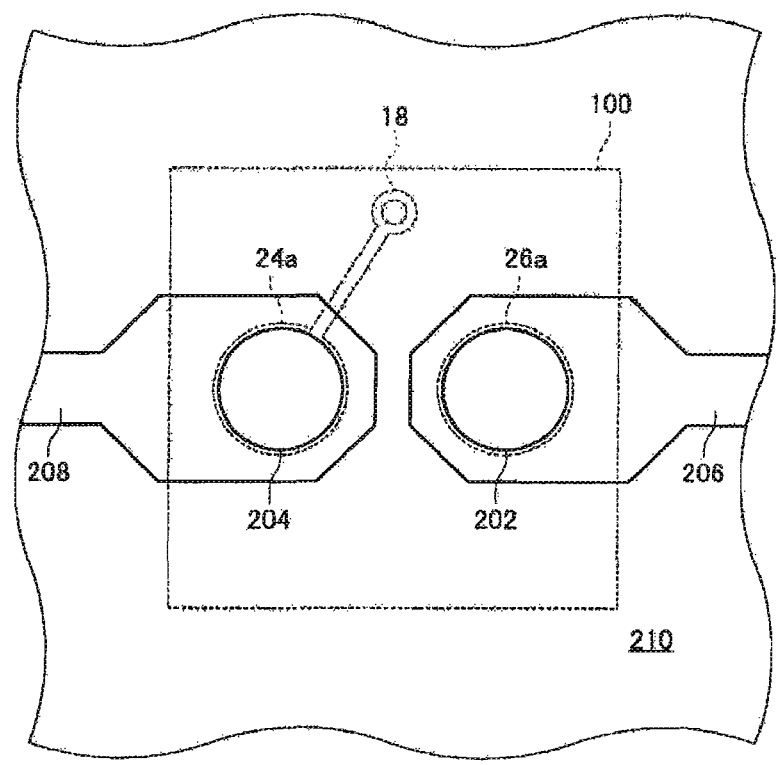
FIG. 6 is a plan view schematically illustrating a second substrate according to the embodiment.

FIG. 5 shows a side view schematically illustrating an optical module 1000. FIG. 6 is a plan view schematically illustrating a second substrate 210, in which the arrangement of the light chip 100 when being subjected to flip-chip bonding is shown by a broken line. The optical module 1000 can be obtained by flip-chip bonding of the light chip 100 on the second substrate 210 according to the step described above.

The optical module 1000 includes a second substrate 210, and a wiring pattern 206 and a wiring pattern 208 formed on the second substrate 210, and a first bump 204 formed on the wiring pattern 208, a second bump 202 formed on the wiring pattern 206, and the above-mentioned light chip 100.

The second substrate 210 can be formed of, for example, a glass substrate. The first bump 204 is formed in the site in which it can be bonded to the pad portion 24a of the light chip 100 seen in plan view as shown in FIG. 5 and FIG. 6. Further, the second bump 202 is formed in the site in which it can be bonded to the pad portion 26a of the light chip 100.

As described above, the cavity 18 of the light chip 100 is formed outside the region 25. Accordingly, the first bump 204 and the second bump 202 are arranged on the sites respectively corresponding to the pad portion 24a and the pad portion 26a. As a result, the cavity 18 is formed outside a region formed by connecting the outermost peripheries of the second bump 202 and the first bump 204 by straight lines.

As shown in FIG. 5, the optical module 1000 may include a resin layer 60 formed by embedding a resin material such as a transparent under fill material between the light chip 100 and the second substrate 210. By this, the entire optical module 1000 can be reinforced and the reflection on the surface of the second substrate 210 can be reduced.

Note that according to this embodiment, the surface emitting laser of vertical cavity type is explained as an example of the optical element; however, it should not be construed restrictively. Other light emitting elements or photodiodes may be used therefor.

4. Effects

As described above, when performing flip-chip bonding, load is applied on the pad portion 24a and the pad portion 26a and the sites of the first bump 204 and the second bump 202 corresponding thereto. Due to this load, tensile stress is generated on the light chip 100 mainly in the direction denoted by the arrow shown in FIG. 3. In particular, as denoted by the arrow, a large tensile stress is generated inside the region 25. As to the outside of the region 25, tensile stress is gradually small towards the cavity 18.

As thus described above, the cavity 18 is formed outside the region 25. Compared with the case in which the cavity 18 is formed inside the region 25, tensile stress applied on the cavity 18 is smaller. Therefore, the damage imparted on the cavity 18 can be reduced and the reliability of the optical module 1000 can be enhanced.

5. Modification Example

The optical module 1000 according to this embodiment has two pad portions and bumps. However, it should not be construed restrictively. More than three pad portions and bumps may be provided.

5.1. First Modification Example

Figure 7:
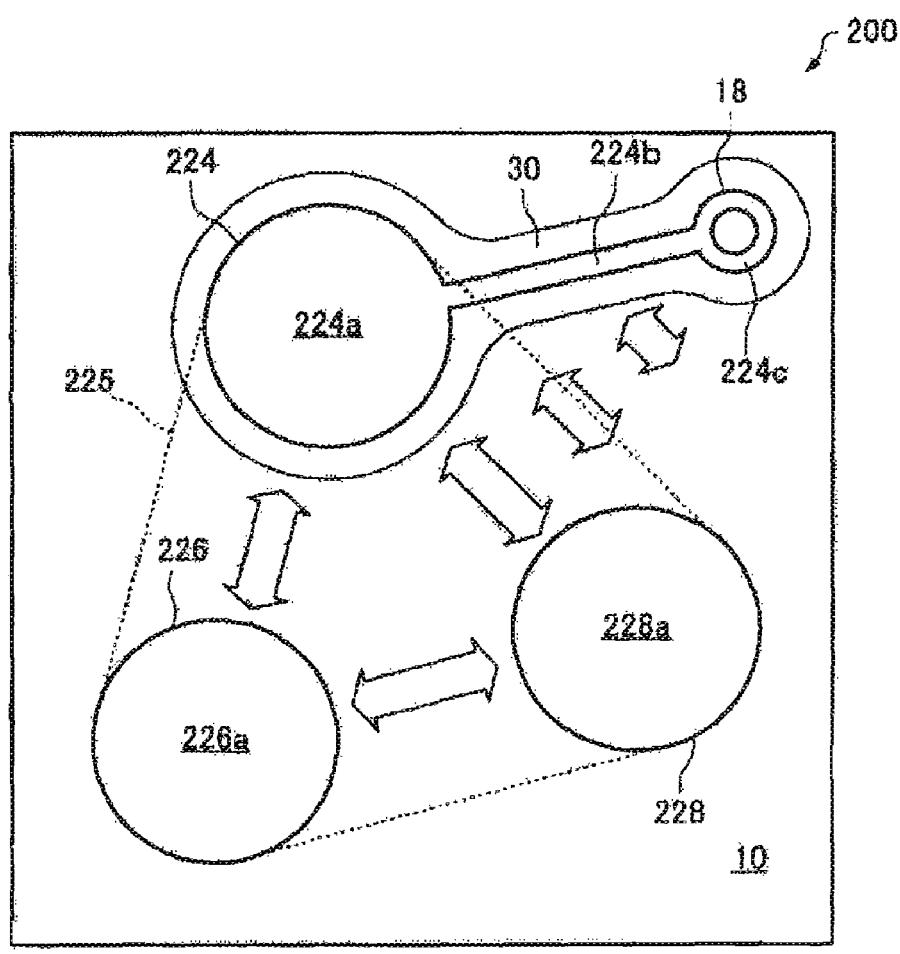
FIG. 7 is a plan view schematically illustrating the light chip according to a first modification example.

FIG. 7 shows a plan view schematically illustrating a light chip 200 according to a first modification example. The light chip 200 has three pad portions.

The light chip 200 has a first electrode 224, a second electrode 226 and a third electrode 228. Of the first electrode 224, the second electrode 226, and the third electrode 228, one of: the second electrode 226 and the third electrode 228; and the first electrode 224 serves as an anode electrode and the other serves as a cathode electrode. The first electrode 224 has a pad portion 224a, 226 has a pad portions 226a, and the third electrode 228 has a pad portion 228a.

In the case of the light chip 200; the cavity 18 is formed outside a region 225 formed by connecting the outermost peripheries of the pad portion 224a and the pad portion 226a and the pad portion 228a by straight lines. The region 225 includes a formation region of the pad portion 224a, the pad portion 226a, and the pad portion 228a, and a region surrounded by a broken line of FIG. 7.

In the light chip 200, there is generated tensile stress in the direction indicated by the arrow shown in FIG. 7 at the time of flip-chip bonding. In particular, as indicated by the arrow, larger tensile stress occurs inside the region 225, while tensile stress outside the region 225 becomes gradually small towards the cavity 18.

Therefore, the cavity 18 is formed outside the region 225, resulting in that tensile stress applied on the cavity 18 is smaller as compared with the case in which the cavity 18 is formed inside the region 225. As a result, the damage imparted on the cavity 18 can be reduced and the reliability of the optical module can be enhanced.

Further, the triangle formed by connecting the centers of the pad portion 224a, the pad portion 226a and the pad portion 228a by straight lines is preferably an equilateral triangle. That is to say, as to the bumps corresponding to the respective pad portions, the triangle formed by connecting the centers thereof by straight lines is also preferably an equilateral triangle.

As a result, the bonding sites of the pad portions and the bumps become well-balanced, thereby making it possible to reduce tensile stress applied on the portion of the cavity 18.

5.2. Second Modification Example

Figure 8:
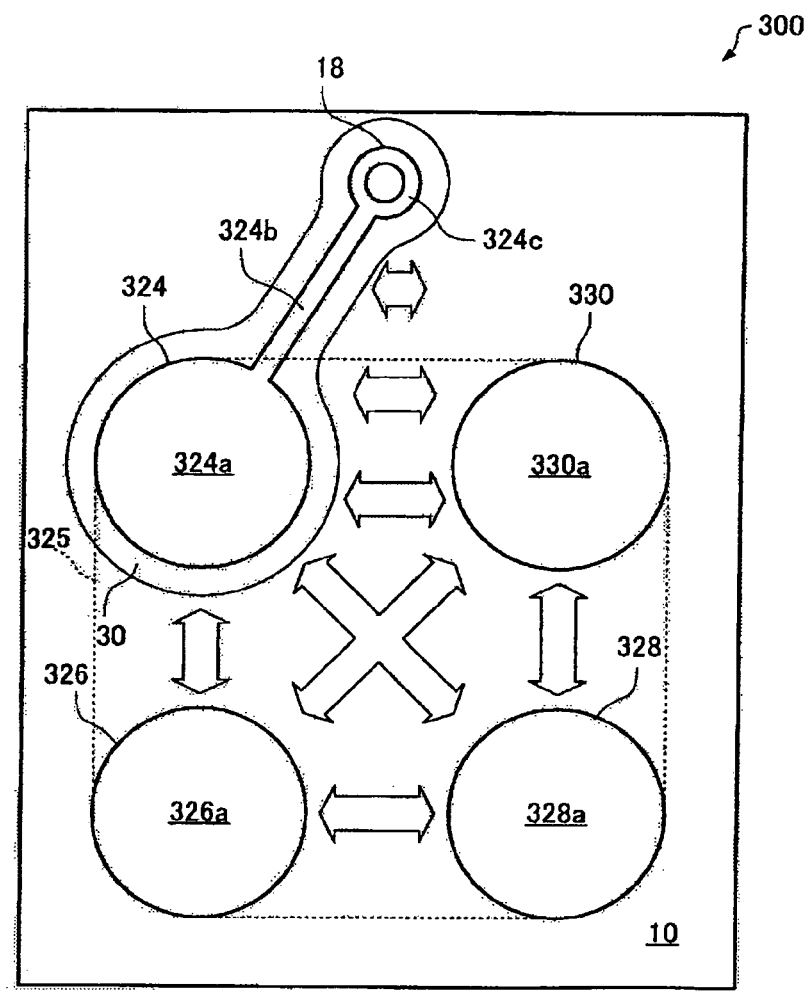
FIG. 8 is a plan view schematically illustrating the light chip according to a second modification example.

FIG. 8 shows a plan view schematically illustrating a light chip 300 according to a second modification example. The light chip 300 includes four pad portions.

The light chip 300 has a first electrode 324, a second electrode 326, a third electrode 328, and a fourth electrode 330. Of the first electrode 324, the second electrode 326, the third electrode 328, and the fourth electrode 330, one of the second electrode 326, the third electrode 328 and the fourth electrode 330; and the first electrode 324 serves as an anode electrode and the other serves as a cathode electrode. The first electrode 324 has a pad portion 324a, 326 has a pad portion 326a, the third electrode 328 has a pad portion 328a, and the fourth electrode 330 has a pad portion 330a.

In the case of the light chip 300, the cavity 18 is formed outside a region 325 formed by connecting the outermost peripheries of the pad portion 324a, the pad portion 326a, the pad portion 328a, and the pad portion 330a by straight lines. The region 325 includes a formation region of the pad portion 324a, the pad portion 326a, and the pad portion 328a, and a region surrounded by a broken line of FIG. 8.

In the light chip 300, there is generated tensile stress in the direction indicated by the arrow shown in FIG. 8 at the time of flip-chip bonding. In particular, as indicated by the arrow, larger tensile stress occurs inside the region 325, while tensile stress outside the region 325 becomes gradually small towards the cavity 18.

Therefore, the cavity 18 is formed outside the region 325, resulting in that tensile stress applied on the cavity 18 is smaller as compared with the case in which the cavity 18 is formed inside the region 325. As a result, the damage imparted on the cavity 18 can be reduced and the reliability of the optical module can be enhanced.

Further, the quadrangle formed by connecting the centers of the pad portion 324a, the pad portion 326a, the pad portion 328a and the pad portion 330a by straight lines is preferably a square. That is to say, as to the bumps corresponding to the respective pad portions, the quadrangle formed by connecting the centers thereof by straight lines is also preferably a square.

As a result, the bonding sites of the pad portions and the bumps become well-balanced, thereby making it possible to reduce tensile stress applied on the portion of the cavity 18.

The present invention is not limited to the above described embodiments. For example, the present invention may include the construction substantially the same construction described in the section of Embodiment (for example, the construction whose function, method and result are similar, or the construction whose object and result are similar). Further, the present invention includes a construction obtained by substituting non-essential parts of the construction described in the section of Embodiment. Furthermore, the present invention includes a construction making it possible to obtain the same operational effects as the construction described in the section of Embodiment or a construction making it possible to achieve the same object as the construction described in the section of Embodiment.

Moreover, the present invention includes a construction obtained by adding the known techniques to the construction described in the section of Embodiment.

INDUSTRIAL APPLICABILITY

As thus described above, the light chip according to the present invention is the light chip having an optical element formed on a first substrate, including: a cavity having an emission surface on the upper surface; a first electrode and a second electrode for driving the optical element; and a plurality of pad portions, for flip-chip bonding to a second substrate, connected to the first electrode and the second electrode, respectively, wherein the cavity is, seen in a plan view, formed outside a region formed by connecting outermost peripheries of the plurality of pad portions by straight lines. Therefore, tensile stress applied on the cavity can be reduced as compared with the region formed inside the region. As a result, it is possible to reduce damage applied to the cavity and enhance the reliability of the optical module.

Further, in the light chip according to the present invention, the plurality of pad portions may be three pad portions and the cavity may be, seen in a plan view, formed outside a region formed by connecting the outermost peripheries of the four pad portions by straight lines.

The optical module according to the present invention is an optical module having: a light chip with an optical element on a first substrate; and a second substrate flip-chip connected to the light chip, wherein the light chip includes: a cavity having an emission surface on the upper surface; a first electrode and a second electrode for driving the optical element; and a plurality of pad portions respectively connected to the first electrode and the second electrode, wherein the second substrate is provided with a plurality of bumps for flip-chip bonding to the first electrode and the second electrode; and wherein the cavity is, seen in a plan view, formed outside a region formed by connecting outermost peripheries of the plurality of bumps by straight lines.

In the optical module according to the present invention, a resin layer may seal between the light chip and the second substrate.

In the optical module according to the present invention, the optical element may be a vertical cavity surface emitting laser.

The invention claimed is:

1. A light chip having an optical element formed on a first substrate, comprising:
   a cavity, formed directly within a surrounding resin layer, comprising at least a first mirror, a second mirror and an active layer formed in between the first mirror and the second mirror, wherein the first mirror, the second mirror, and the active layer all have a same width or radius, and having an emission surface on the upper surface;
   a first electrode and a second electrode for driving the optical element; and
   a plurality of pad portions, for flip-chip bonding to a second substrate, connected to the first electrode and the second electrode, respectively,
   wherein the cavity is, seen in a plan view, formed outside a region between the plurality of pad portions,
   the surrounding resin layer is located beneath the first electrode and has a height that decreases as the surrounding resin layer extends radially outward from the cavity, and
   a first surface of the active layer is completely disposed upon a first surface of the first mirror and a first surface of the second mirror is completely disposed upon a second surface of the active layer.

2. The light chip according to claim 1, wherein:
   the plurality of pad portions are three pad portions; and
   the cavity is, seen in a plan view, formed outside a region between the three pad portions.

3. The light chip according to claim 1, wherein:
   the plurality of pad portions are four pad portions; and
   the cavity is, seen in a plan view, formed outside a region between the four pad portions.

4. An optical module having: a light chip with an optical element on a first substrate; and a second substrate flip-chip connected to the light chip,
   wherein the light chip includes:
   a cavity, formed directly within a surrounding resin layer, comprising at least a first mirror, a second mirror and an active layer formed in between the first mirror and the second mirror, wherein the first mirror, the second mirror, and the active layer all have a same width or radius, and having an emission surface on the upper surface;
   a first electrode and a second electrode for driving the optical element; and
   a plurality of pad portions respectively connected to the first electrode and the second electrode,
   wherein the second substrate is provided with a plurality of bumps for flip-chip bonding to the first electrode and the second electrode,
   the cavity is, seen in a plan view, formed outside a region between the plurality of bumps,
   the surrounding resin layer is located beneath the first electrode and has a height that decreases as the surrounding resin layer extends radially outward from the cavity, and
   wherein a first surface of the active layer is completely disposed upon a first surface of the first mirror and a first surface of the second mirror is completely disposed upon a second surface of the active layer.

5. The optical module according to claim 4, wherein a resin layer seals between the light chip and the second substrate.

6. The optical module according to claim 4, wherein the optical element is a vertical cavity surface emitting laser.

7. The optical module according to claim 5, wherein the optical element is a vertical cavity surface emitting laser.

* * * * *